US008345887B1

(12) United States Patent
Betbeder

(10) Patent No.: US 8,345,887 B1
(45) Date of Patent: Jan. 1, 2013

(54) COMPUTATIONALLY EFFICIENT SYNTHETIC REVERBERATION

(75) Inventor: Laurent M. Betbeder, Oakland, CA (US)

(73) Assignee: Sony Computer Entertainment America Inc., Foster City, CA (US)

( * ) Notice: Subject to any disclaimer, the term of this patent is extended or adjusted under 35 U.S.C. 154(b) by 1285 days.

(21) Appl. No.: 11/710,080

(22) Filed: Feb. 23, 2007

(51) Int. Cl.
*H03G 3/00* (2006.01)

(52) U.S. Cl. ................ 381/63; 381/61; 381/20; 381/98; 381/102

(58) Field of Classification Search .................. 381/1, 2, 381/5, 10, 19, 20, 22, 28, 97, 98, 99, 102, 381/103, 108, 61, 63
See application file for complete search history.

(56) References Cited

U.S. PATENT DOCUMENTS

| | | | | | |
|---|---|---|---|---|---|
| 4,446,530 | A | * | 5/1984 | Tsuboka | 708/400 |
| 4,991,218 | A | * | 2/1991 | Kramer | 381/61 |
| 5,851,187 | A | * | 12/1998 | Thomas et al. | 600/447 |
| 2004/0213416 | A1 | * | 10/2004 | Dahl et al. | 381/63 |

* cited by examiner

*Primary Examiner* — Xu Mei
*Assistant Examiner* — Leshui Zhang
(74) *Attorney, Agent, or Firm* — Blakely, Sokoloff, Taylor & Zafman LLP

(57) ABSTRACT

A digital audio signal processor uses a matrix transform to produce a multi-channel synthetic reverberation signal based on variably-delayed versions of an input signal. The matrix transform outputs are mixed with the inputs to the signal delaying mechanisms, and some of the outputs are further processed to create the reverberation signal.

22 Claims, 8 Drawing Sheets

COMPUTATIONALLY EFFICIENT SYNTHETIC REVERBERATION

FIELD

The invention relates to audio signal processing. More specifically, the invention relates to efficient methods to produce a de-correlated multi-channel synthetic reverberation.

BACKGROUND

Humans detect and process information arriving through a number of different channels. After light signals (vision), sound and hearing may contribute most heavily to one's perception of one's environment. The human auditory system is remarkably discriminating, and though it often fares poorly in comparisons with lower animals, people can detect subtle cues in an audio signal and use them to make inferences about their surroundings, even when those surroundings cannot be seen. The detection and inference occur largely subconsciously, so a carefully-prepared audio program can provide an extremely compelling and visceral experience for a listener.

Virtual reality and game applications can be greatly enhanced by an accurate audio rendering of a simulated environment. Unfortunately, producing a high-resolution, multi-channel audio stream that models the interaction of sounds from various sources with surfaces, spaces and objects in the simulated environment can be as computationally expensive as producing a sequence of high-resolution visual images of the same environment. Techniques for producing convincing audio effects with fewer calculations may be of value in this area.

FIG. 2 shows a canonical feedback-delay network ("FDN") that can be used to add synthetic reverberation effects to an input signal 110. When signal 110 enters the network, a scaler (amplifier or attenuator) 170 passes a "dry" version of the signal through to the output mixer 260. Several additional scaled versions of input signal 110 are produced by input scalers 220, and these signals enter a plurality of delay lines 230, 233, 236. Each delay line delays the signal entering it by a predetermined period. The signals leaving the delay lines may be further amplified or attenuated by output scalers 250, and the signals are mixed with the dry signal from scaler 170 to produce a single-channel output signal 270. The outputs of the delay lines are also fed back through feedback matrix 240 and mixed with the scaled delay line inputs.

The individual delay lines produce discrete echoes of the input signal, each echo delayed by the length of the corresponding delay line. The feedback matrix mixes the variously-delayed output signals; matrix coefficients and scaling values are chosen so that the output signal 260 includes exponentially-decaying colored noise to simulate secondary, tertiary and subsequent echoes from objects in the environment that do not produce a specific, identifiable primary echo.

FIG. 3 shows a sample time-intensity plot of the impulse response of a FDN. At t=0, an impulse or "slap" is sent into the network; peak 310 is the dry signal response. Then, during time period 320, peaks 322, 325 and 328 correspond to discrete echoes of the slap from the delay lines. Finally, during period 330, feedback through the feedback matrix creates an exponentially-decaying "tail" simulated reverberation 335.

The feedback-delay network shown in FIG. 2 can produce an adequate synthetic reverberation effect, but it only produces a single channel, and is fairly computationally expensive. Furthermore, if multiple output channels are desired (for example, to drive stereo or modern multi-channel sound systems), multiple single-channel FDNs may be operated, or a modified FDN like that shown in FIG. 4 may be used. The computational expense is increased by passing the scaled, delayed outputs through an output matrix 460. Also, if the number of output channels is different from the number of delay lines, the output matrix is not square, so efficient matrix multiplication algorithms cannot be used.

An alternate arrangement that can produce multi-channel synthetic reverberation effects with fewer calculations may be of value.

BRIEF DESCRIPTION OF DRAWINGS

Embodiments of the invention are illustrated by way of example and not by way of limitation in the figures of the accompanying drawings in which like references indicate similar elements. It should be noted that references to "an" or "one" embodiment in this disclosure are not necessarily to the same embodiment, and such references mean "at least one."

DETAILED DESCRIPTION

Embodiments of the invention produce a plurality of synthetic reverberation signals from an input signal by performing a matrix transform on a larger plurality of delayed, scaled versions of the input signal. Outputs of the matrix transformation are mixed back with the inputs of the delay lines to produce a decaying noise tail that simulates diffuse audio reflections.

Figure 1:
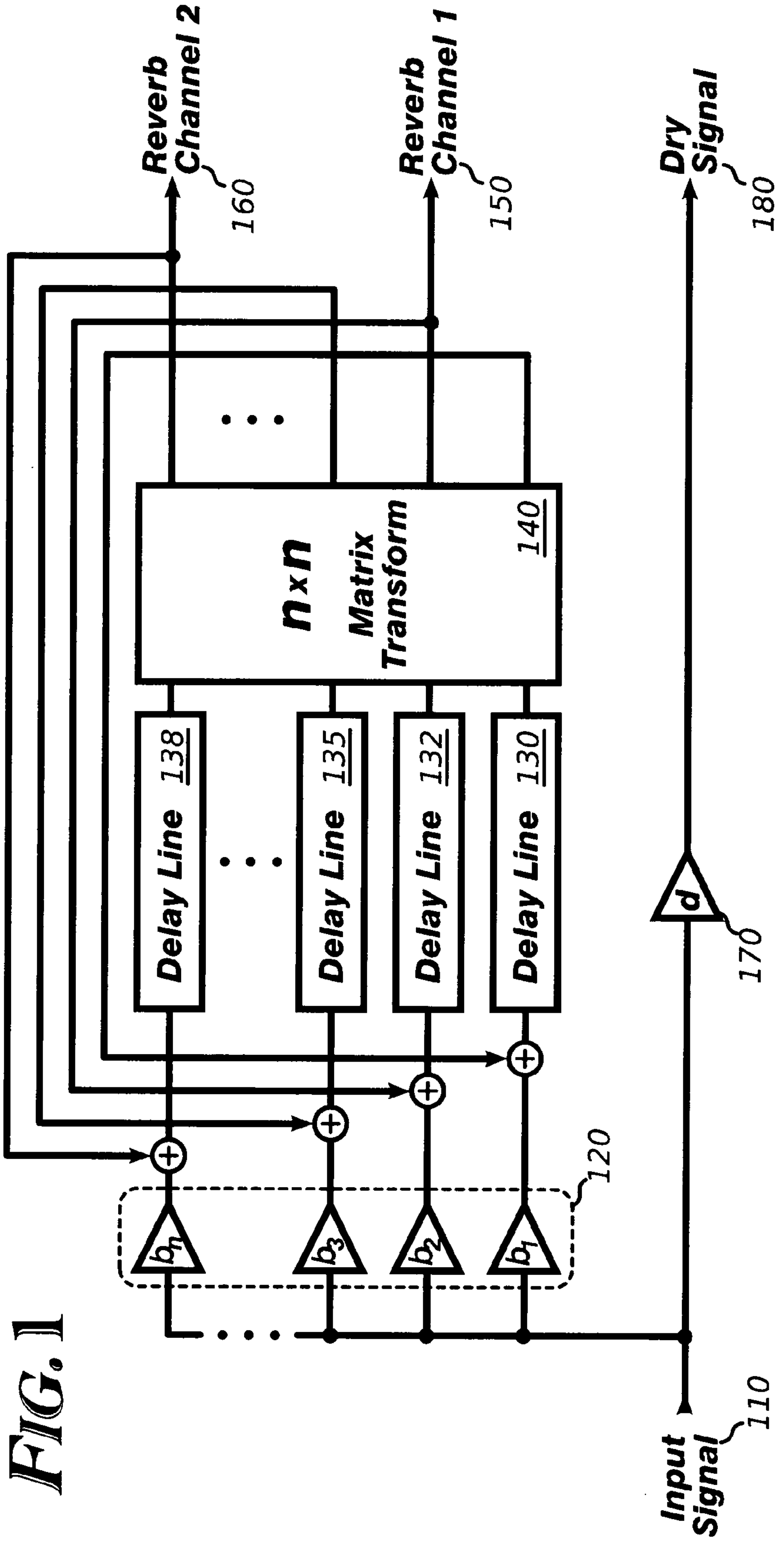
FIG. 1 shows a signal processing network according to an embodiment of the invention.
Figure 2:
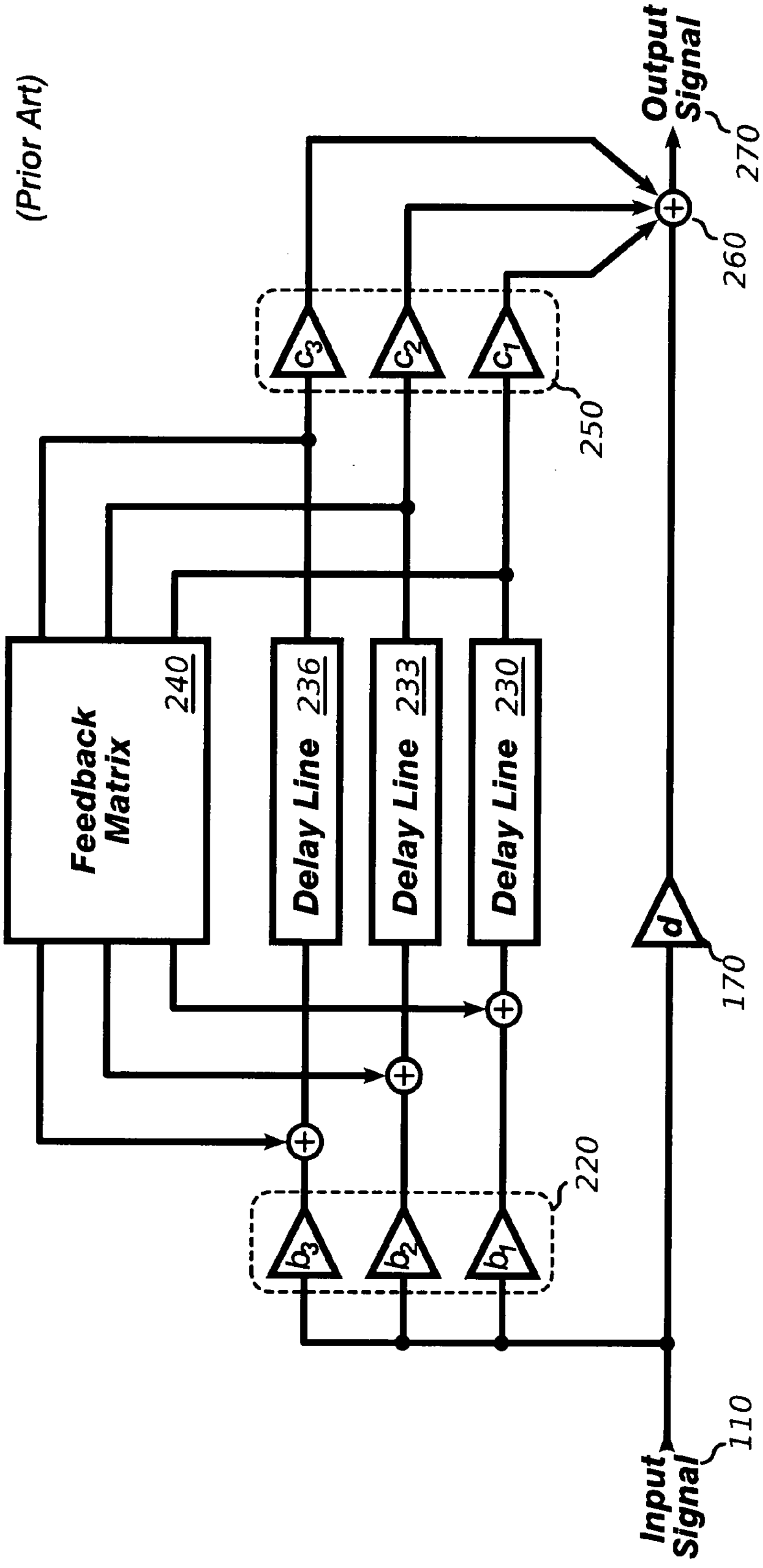
FIG. 2 (Prior Art)
FIG. 2 shows a prior-art feedback-delay network to produce a single channel synthetic reverberation signal.
Figure 3:
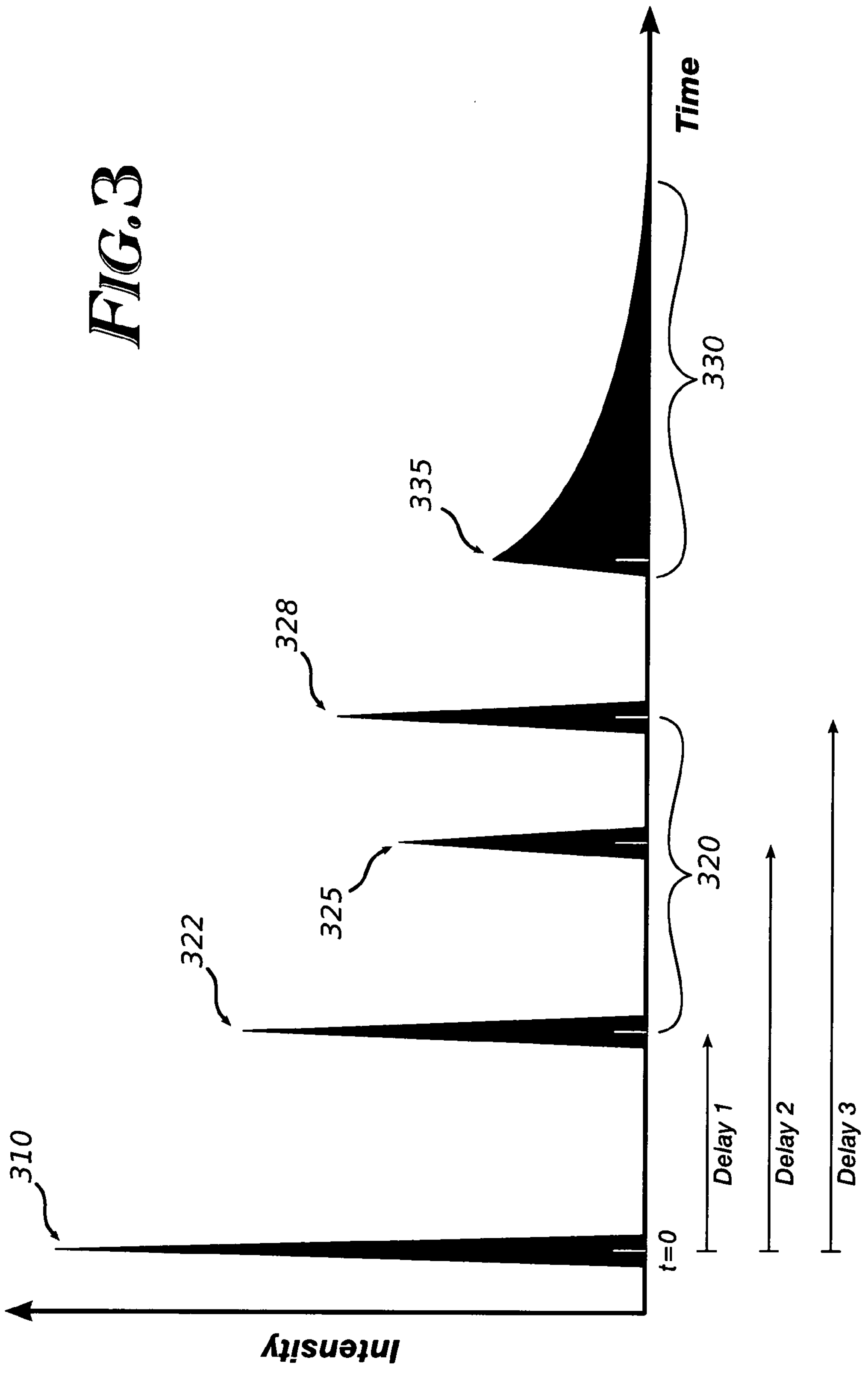
FIG. 3 shows the impulse response of a feedback-delay network.
Figure 4:
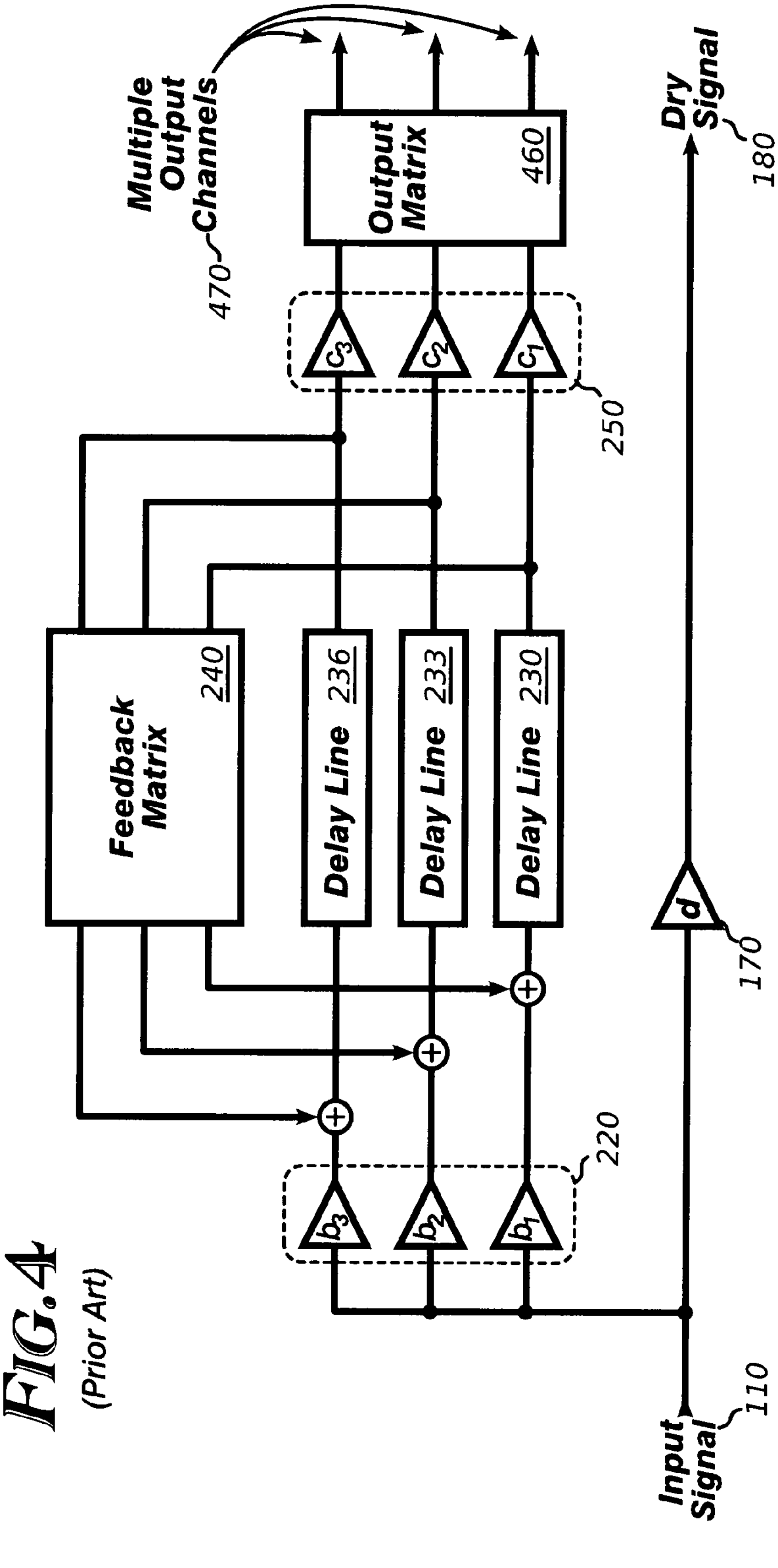
FIG. 4 (Prior Art)
FIG. 4 shows how multiple reverberation channels are produced in the prior art.

FIG. 1 shows a modified feedback-delay network that produces a plurality of synthetic reverberation signals based on an input signal. This FDN produces multiple, de-correlated reverberation signals with much less computation than prior approaches. An input signal 110 enters the network, and a scaler (amplifier or attenuator) 170 produces level-adjusted dry signal 180. Scalers 120 produce level-adjusted copies of input signal 110. Some copies may be at the same adjusted level, while other copies may be at different levels. The level-adjusted signals enter a corresponding plurality of delay lines 130, 132, 135 . . . 138. Each delay line delays the signal entering it for a predetermined period of time. Delay line delays should be mutually prime (i.e. they should have no common divisors besides 1) to maximize time-domain feedback scattering (density) and to avoid frequency-domain pole superposition (eigenmodes shared by multiple delay lines).

The adjusted, delayed signals exiting delay lines 130-138 are treated as a vector and processed by an n×n matrix transform 140, producing a corresponding n-element output vector. Elements of this vector are fed back and mixed with the adjusted input signals entering delay lines 130-138. A subset of the output vector elements are also passed out of the FDN for further processing as independent synthetic reverberation channels (150, 160).

The feedback-delay network shown in FIG. 1 has n signal adjusters, n delay lines, and an n×n matrix transform. N may be any number (subject to certain restrictions discussed below), but in practical systems, values of 16 or 32 may provide the best balance between power and flexibility to create a rich, convincing reverberation effect on one hand, and computational efficiency on the other.

Figure 5:
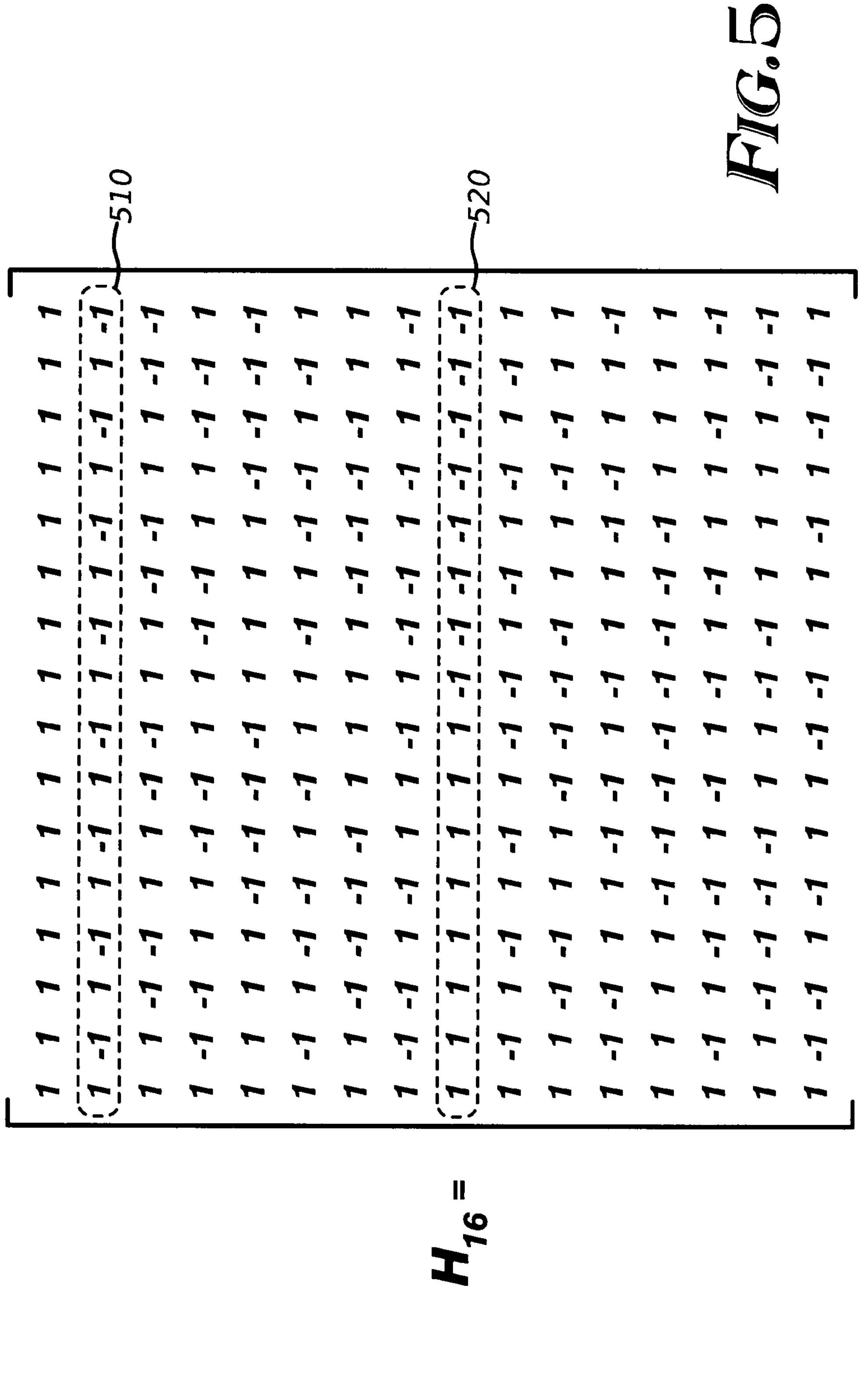
FIG. 5 shows an order-16 Hadamard matrix.

The n×n matrix transform indicated as element 140 of FIG. 1 is a discrete Fourier transform, and can be computed efficiently by any known fast Fourier transform ("FFT") algorithm. One matrix that can be used in the transform is the Hadamard matrix. A Hadamard matrix (named after French mathematician Jacques Hadamard) is a square matrix whose entries are either 1 or −1, and whose rows are orthogonal. It follows from this definition that a Hadamard matrix of order n (that is, an n×n Hadamard matrix) satisfies this equation:

$$HH^T = nI_n \quad \text{Eq. 1}$$

where $I_n$ is the n×n identity matrix. Hadamard matrices must be of order 1, 2 or a multiple of 4. Common embodiments of the invention use a Hadamard matrix of order 16, shown in FIG. 5.

Experiments show that not all outputs of a transform with a Hadamard matrix are useable as a synthetic reverberation channel (although all outputs are fed back to the inputs of the delay lines). Only about half $$\frac{M}{2} - 1,$$

for an order M matrix) of the outputs are useable. However, using M=16 gives 7 useable channels, which fits conveniently with a common "surround sound" format that uses seven primary audio channels and one low-frequency channel ("7.1-channel audio"). Furthermore, since $M=16=2^k$ for k=4, the Fast Walsh Hadamard Transform ("FWHT") may be used in place of a conventional matrix multiplication to further improve computation efficiency.

Useable outputs can be selected by auditioning them directly, but it has been observed that the best-sounding rows are those that have the most "sign interleaving." For example, row 510 has alternating ones and negative ones, so it is likely to produce a useable reverberation channel, while row 520 has eight successive ones, followed by eight successive negative ones, so it is likely to produce a signal that is not a convincing reverberation simulation. Mathematically, this is believed to be related to the effectiveness of pole/zero cancellation achieved by the FDN: better pole/zero alignment provides better signal characteristics. (Note that perfect pole/zero alignment is difficult to achieve in practice, and is undesirable in any case because it would eliminate the desired synthetic reverberation effect.)

In addition to the effect of sign interleaving discussed above, delay line lengths also contribute to the perceived quality of the reverberation channels. Delay line lengths are relatively prime, for reasons discussed earlier, but lengths that are closer produce signals that are closer in phase for the frequencies that are perceptually important (approximately 20-100 Hz). Delay line length differences on the order of 100 samples (at a sampling rate of 48 KHz) produce delayed signals that are only about to ¼ to 1⁄20 period out of phase, so matrix rows with more sign interleaving provide better pole/zero cancellation in the important frequency range. To reduce network configuration and operation complexity, it is preferred to arrange delay lines in order of increasing (or decreasing) delay lengths, instead of arranging them randomly. For signals thus arranged, nearby matrix rows with more sign interleaving provide better pole/zero cancellation than lines that are farther apart and/or that have less sign interleaving.

Figure 6:
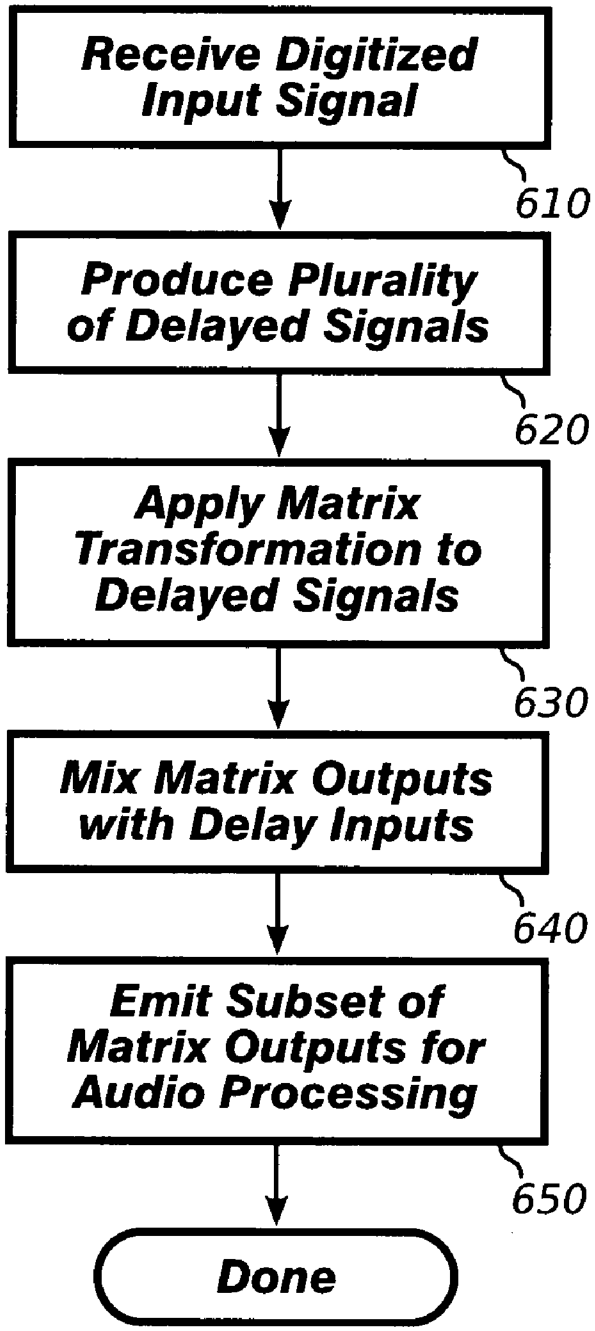
FIG. 6 outlines the operation of a signal processing network that implements an embodiment of the invention.

FIG. 6 outlines a method by which an embodiment of the invention operates. A digitized audio signal is received to begin processing (610). The signal may be entirely synthetic (e.g. generated by an algorithmic process) or may be a digitized version of an actual sound recorded earlier or detected in real time by a microphone or similar sensor. A plurality of variably-delayed copies of the signal are produced (620), for example by passing the signal through a plurality of delay lines. The delayed signals are subjected to a matrix transformation (630) by a Fourier or Hadamard transform to produce a corresponding plurality of transformed signals. The matrix outputs are mixed with the pre-delay digitized audio signal (640). Also, some of the outputs are emitted for further audio processing (650). For example, the outputs may be mixed with reverberation channels produced based on other input signals, and channels may be assigned to one channel of a multi-channel sound system. Output signals may be aggregated using an encoding system such as Dolby Digital™ and provided to an amplifier to be amplified and rendered by a sound emitter such as a speaker array or headphone.

Figure 7:
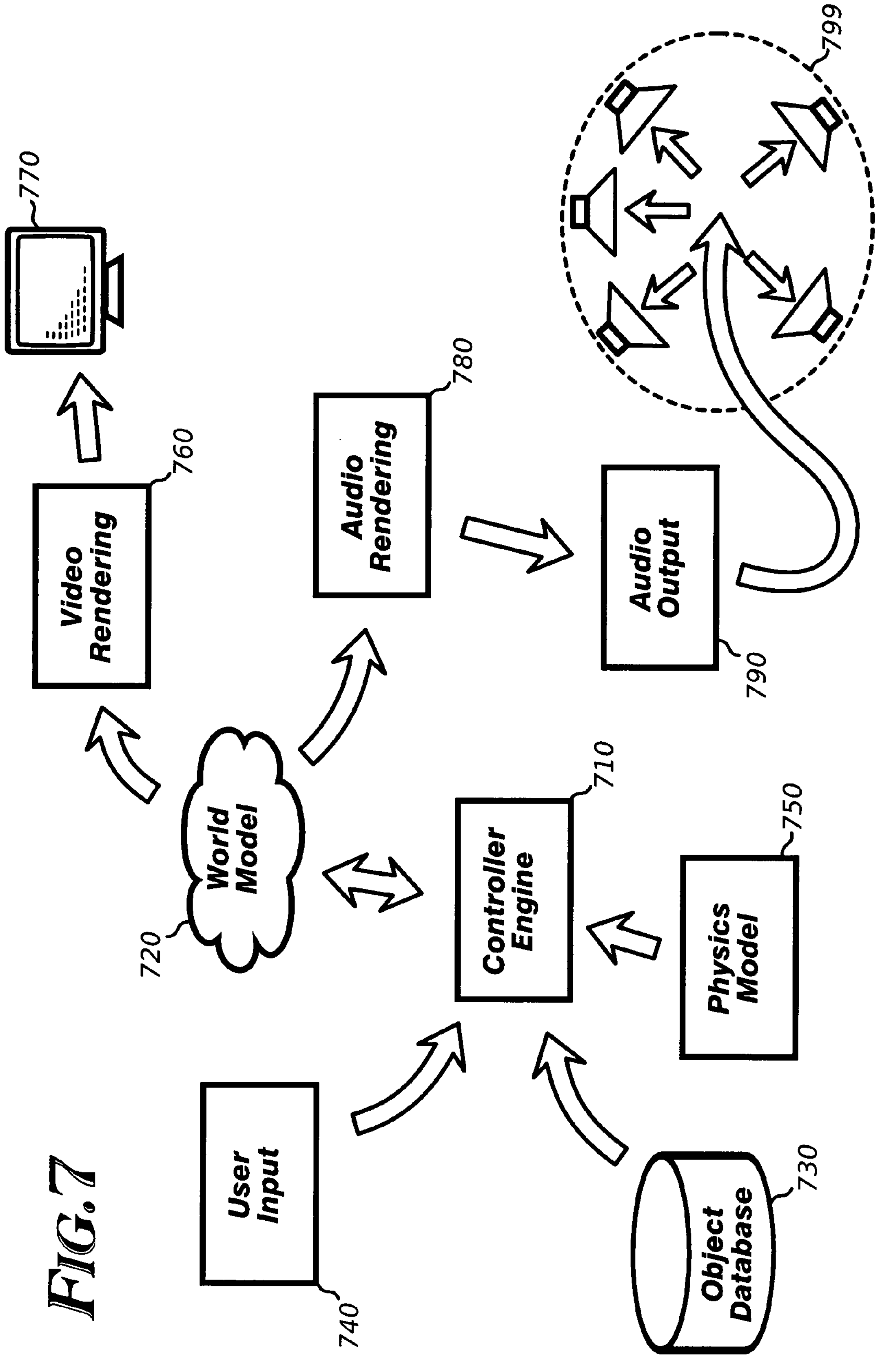
FIG. 7 shows a system that incorporates a signal processing network.

FIG. 7 shows a system incorporating an embodiment of the invention. A controller engine 710 uses information from many sources to construct and maintain a world model 720. For example, information in object database 730 may describe the size, shape, color, mass, sound and other characteristics of objects that can be instantiated in world model 720. User input 740 is collected via a controller such as a joystick, keypad, button array or other similar device, and the controller engine simulates the evolution of world model 720 under the influence of user input 740 and any applicable physics model 750. Periodically (e.g. once every thirtieth or sixtieth of a second) video rendering subsystem 760 creates snapshots of the world model from one or more vantage points and displays them on a monitor 770. Of relevance to embodiments of the present invention, audio rendering subsystem 780 computes the auditory environment that would be experienced at a particular vantage point by mixing various input sources according to their spatial locations, computing synthetic reverberation signals using the efficient feedback-delay network ("FDN") described above, panning and mixing the output channels, and perhaps encoding the channels for an audio output device 790, which plays the channels on a multi-channel speaker system 799. (The speaker system pictured has five primary speakers and one low-frequency emitter, not shown, so it would be a "5.1" system.)

Figure 8:
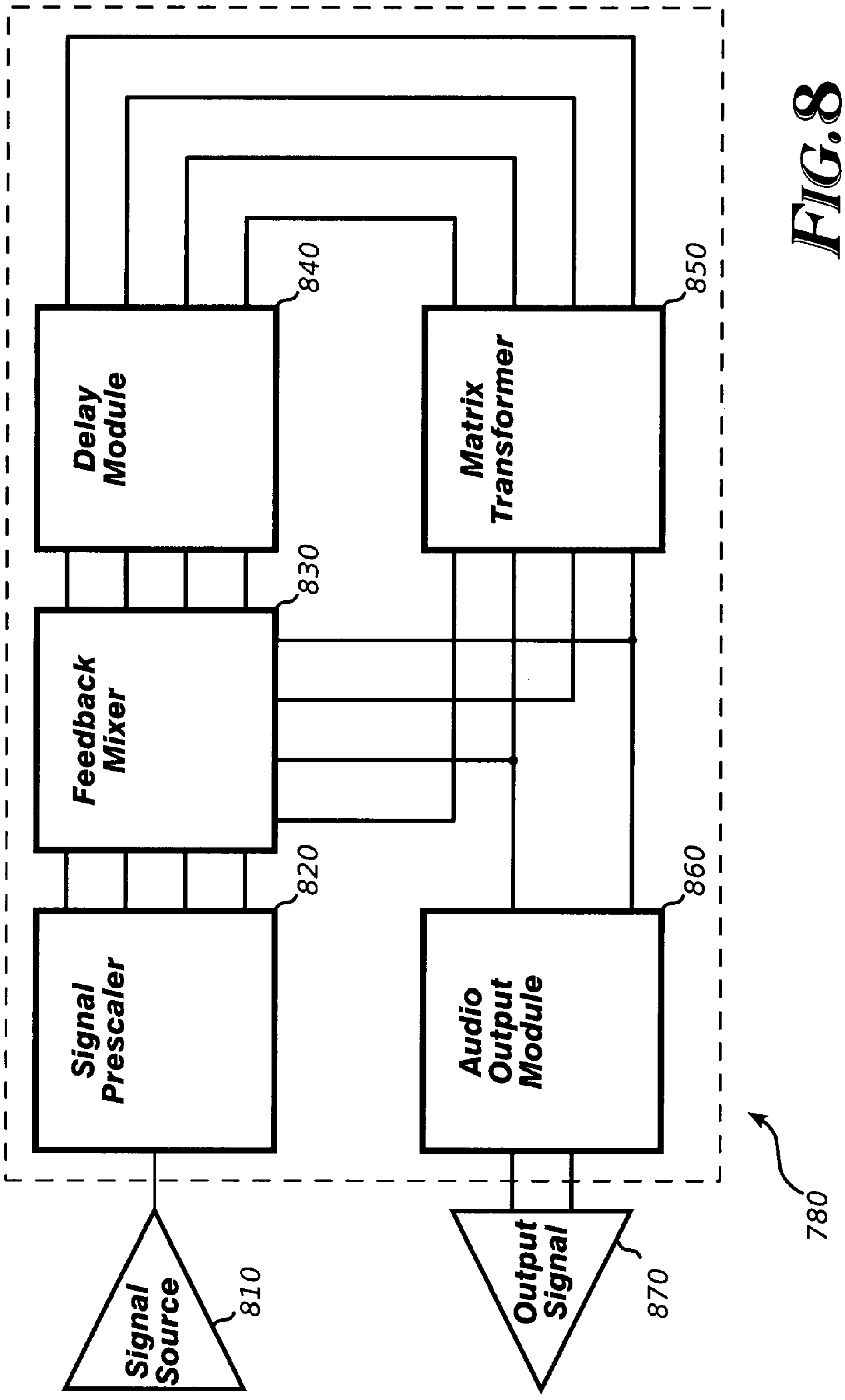
FIG. 8 shows a portion of the system of FIG. 7 in greater detail.

FIG. 8 shows audio rendering subsystem 780 in greater detail. An audio signal source 810 provides a signal to be rendered. Signal prescaler 820 may produce variably-scaled (attenuated or amplified) versions of the input signal. The scaled signals are mixed with outputs of matrix transformer 850 by feedback mixer 830. The mixed signals are delayed by varying amounts by delay module 840, and the delayed signals are presented as inputs to matrix transformer 850. Finally, some outputs of matrix transformer 850 are accepted by audio output module 860, which prepares output signal 870. Output signal 870 may be, for example, an audio signal encoded for a multi-channel surround sound system such as a quadraphonic system, a 5.1 system, a 7.1 system, or even a 13.2 system.

Sound signals processed by audio rendering subsystem 780 may include digitized samples of car and motorcycle engines, sirens, airplanes and construction equipment; gunshots, explosions, waves and splashes; and synthesized, imaginary sounds such as laser shots and animated character pratfalls. Live audio can also be inserted into the world model from a microphone input and processed according to the auditory environment formed by the objects in the world model.

It is appreciated that embodiments of the invention can be used to add synthetic reverberation effects to any audio signal, not only the audio signals associated with a virtual or gaming environment. For example, an embodiment can be incorporated within an "effects pedal," which is a device used to alter the sound of a musical instrument such as a guitar or keyboard. Embodiments can also add reverberation effects to live or recorded voice, drum, or other audio sources.

An embodiment of the invention may be a machine-readable medium having stored thereon instructions which cause a programmable processor to perform operations as described above. Embodiments can also be implemented as programs or configurations for special purpose digital signal processor ("DSP") engines. In other embodiments, the operations might be performed by specific hardware components that perform amplification, delay, mixing and matrix transformation functions. Those operations might alternatively be performed by any combination of programmed computer components and custom hardware components.

A machine-readable medium may include any mechanism for storing or transmitting information in a form readable by a machine (e.g., a computer), including but not limited to Compact Disc Read-Only Memory (CD-ROM), Read-Only Memory (ROM), Random Access Memory (RAM), and Erasable Programmable Read-Only Memory (EPROM).

The applications of the present invention have been described largely by reference to specific examples and in terms of particular allocations of functionality to certain hardware and/or software components. However, those of skill in the art will recognize that synthetic reverberation effects based on a Fourier or Hadamard matrix transformation can also be produced by software and hardware that distribute the functions of embodiments of this invention differently than herein described. Such variations and implementations are understood to be captured according to the following claims.

I claim:

1. A signal processor comprising:

a plurality of delay lines, each to accept an audio signal presented at an input of the delay line and emit a delayed version of the audio signal at an output of the delay line;

a matrix transformer having a respective plurality of inputs coupled to the outputs of the plurality of delay lines to apply a matrix transform to a first vector including the delayed versions of the audio signals emitted by the outputs of the plurality of delay lines, the matrix transform to produce a second vector on a plurality of outputs of the matrix transformer; and a plurality of feedback mixers having respective inputs coupled to the outputs of the matrix transformer, each to mix an element of the second vector with the audio signal presented to an input of a corresponding one of the plurality of delay lines, wherein a subset of elements of the second vector are to be further processed as a multi-channel synthetic reverberation signal.

2. The signal processor of claim 1, further comprising:

a plurality of scaling modules, each scaling module to supply an attenuated version of the input audio signal presented to the input of a corresponding delay line.

3. The signal processor of claim 1 wherein a matrix of the matrix transform is a Hadamard matrix.

4. The signal processor of claim 3 wherein the Hadamard matrix is a 16×16 Hadamard matrix.

5. The signal processor of claim 1 wherein a matrix of the matrix transform is a Fourier Transform matrix.

6. The signal processor of claim 1, wherein a period of time of delay for each of the delayed versions of the audio signal presented at the input of the delay line is mutually prime.

7. The signal processor of claim 1, wherein the subset of elements of the second vector to be further processed as a multi-channel synthetic reverberation signal are selected from corresponding rows of the matrix that have the most sign interleaving.

8. The signal processor of claim 1, wherein the delay lines are arranged in order of corresponding delay lengths.

9. A method comprising:

producing a plurality of differently-delayed versions of an input audio signal by a plurality of delay lines;

applying a matrix transformation to the differently-delayed versions of the input audio signal to produce a vector on a plurality of outputs of the matrix transformation; and feeding the outputs of the matrix transformation back into the input audio signal by mixing an element of the vector with the respective input audio signal; wherein a subset of the outputs of the matrix transformation are to be processed as a multi-channel synthetic reverberation signal.

10. The method of claim 9, further comprising:

scaling the input audio signal before producing one of the plurality of differently-delayed versions of the input audio signal.

11. The method of claim 9 wherein the matrix transformation is a Fourier transform.

12. The method of claim 9 wherein the matrix transformation is a Hadamard transform.

13. The method of claim 9 wherein the applying the matrix transformation comprises computing a Fast Walsh-Hadamard Transform ("FWHT").

14. The method of claim 9, further comprising:

encoding the subset of outputs into a 7.1-channel audio signal.

15. A system comprising:

an audio signal source;

a delay module to produce a plurality of delayed versions of an audio signal from the audio signal source, at least two of the delayed versions having different delays;

a matrix transformation module to perform a matrix transformation on the plurality of delayed versions of the audio signal;

a feedback module to mix a plurality of outputs of the matrix transformation module with the respective audio signal from the audio signal source; and an audio output module to produce a multi-channel synthetic reverberation signal from a subset of the plurality of the outputs of the matrix transformation module.

16. The system of claim 15, further comprising:

a signal prescaler to adjust a level of the audio signal, wherein the delay module is to produce a plurality of delayed versions of the level-adjusted audio signal.

17. The system of claim 15 wherein the multi-channel synthetic reverberation signal is encoded for playback by a 7.1-channel audio system.

18. The system of claim 15 wherein the audio signal is a digital sample of a motorcycle engine sound.

19. The system of claim 15 wherein the audio signal is a digital sample of a gunshot sound.

20. The system of claim 15 wherein the audio signal is a digital sample of a siren sound.

21. The system of claim 15 wherein the audio signal is a digitized signal from a musical instrument.

22. The system of claim 15 wherein the audio signal is a digitized signal from a microphone.

* * * * *